United States Patent [19]
Allen

[11] Patent Number: 4,653,079
[45] Date of Patent: Mar. 24, 1987

[54] PULSE DOUBLER CIRCUIT WITH COMPLEMENTARY PULSE INPUTS

[75] Inventor: Gordon H. Allen, Gilbert, Ariz.

[73] Assignee: Motorola, Inc., Schaumburg, Ill.

[21] Appl. No.: 823,449

[22] Filed: Jan. 28, 1986

[51] Int. Cl.[4] .......................... H03K 3/64; H03K 3/78
[52] U.S. Cl. ..................................... 377/47; 307/261; 307/271; 307/219.1; 328/15; 328/20
[58] Field of Search ................. 377/47; 328/15, 34, 328/20; 307/271, 261, 522, 529, 219.1

[56] References Cited
U.S. PATENT DOCUMENTS 3,555,258  1/1971  Berthier ................................ 328/34
3,562,673  2/1971  Caspari ................................. 328/34

Primary Examiner—Stanley D. Miller
Assistant Examiner—K. Ohralik
Attorney, Agent, or Firm—Michael D. Bingham

[57] ABSTRACT

A circuit for producing a pair of output pulses for each cycle of differentially applied input pulses includes a pair of input transistors to which the differential input pulses are applied and a pair of output transistors the collectors of which are connected to an output of the pulse doubling circuit and the bases of which are respectively coupled to the emitters of a corresponding input transistor. A pair of delay circuits are provided coupled respectively from one of the input transistors to the base of the opposite output transistor. The output transistors are responsive to the respective input transistor being rendered conductive while the other input transistor is rendered non-conductive for causing the output voltage to change from a first level to a second level while the one delay circuit is responsive to the other input transistor turning off for turning the respective output transistor to turn off a predetermined time thereafter thereby causing the output voltage to change from the second level to the first level.

11 Claims, 2 Drawing Figures

PULSE DOUBLER CIRCUIT WITH COMPLEMENTARY PULSE INPUTS

BACKGROUND OF THE INVENTION

The present invention is related to frequency multipliers and, more particularly, to a circuit for producing a pair of output pulses for each cycle of an applied input pulse.

There is a myriad of uses for pulse doubling circuits. For instance, pulse doubling circuits find applications as tachometeters, DC to DC step up converters and in logic system applications to name but a few. A pulse doubling circuit may also find use in a digital transceiver system wherein digital coded input data is received and decoded. One such transceiver system uses a current to voltage comparator circuit in conjunction with a pulse generator, RLC tank circuit and a pulse doubler circuit for producing an output clock pulse train for interpreting the coded input data. To maintain the clock train in synchronization with the input data, to ensure that the input data is properly decoded, it is necessary that the widths of the pulses of the clock train not vary.

Hence, a need exists for a pulse doubler circuit suited to be manufactured in monolithic integrated form in which the pulses produced therefrom are substantially independent to power supply, temperature and process variations.

SUMMARY OF THE INVENTION

Accordingly, it is an object of the present invention to provide an improved pulse doubling circuit and method for producing output pulses at twice the frequency of applied input pulses.

It is another object of the invention to provide an improved integrated pulse doubling circuit.

In accordance with the above and other objects there is provided a pulse doubling circuit comprising first and second input transistor circuits that are differentially rendered conductive and non-conductive in response to applied differential input pulses, first and second output transistor circuits coupled to the output of the circuit, the first output transistor circuit being responsive to the first input transistor circuit being turned on for causing the voltage at the output to change from a high level to a low level, and first and second delay circuits, the first delay circuit being responsive to the second input transistor circuit being rendered non-conductive for turning the first output transistor circuit off to cause the voltage at the output to change from the low level to the high level a predetermined time after the first output transistor circuit was turned on and the second output transistor circuit being responsive to the second input transistor circuit being rendered conductive for causing the voltage at the output to change from a high level to a low level and the second delay circuit being responsive to the first input transistor circuit being rendered non-conductive for turning off the second output transistor circuit a predetermined time thereafter thereby causing the voltage at the output to change from the low level to the high level.

DETAILED DESCRIPTION OF THE PREFERRED EMBODIMENT

Figure 1:
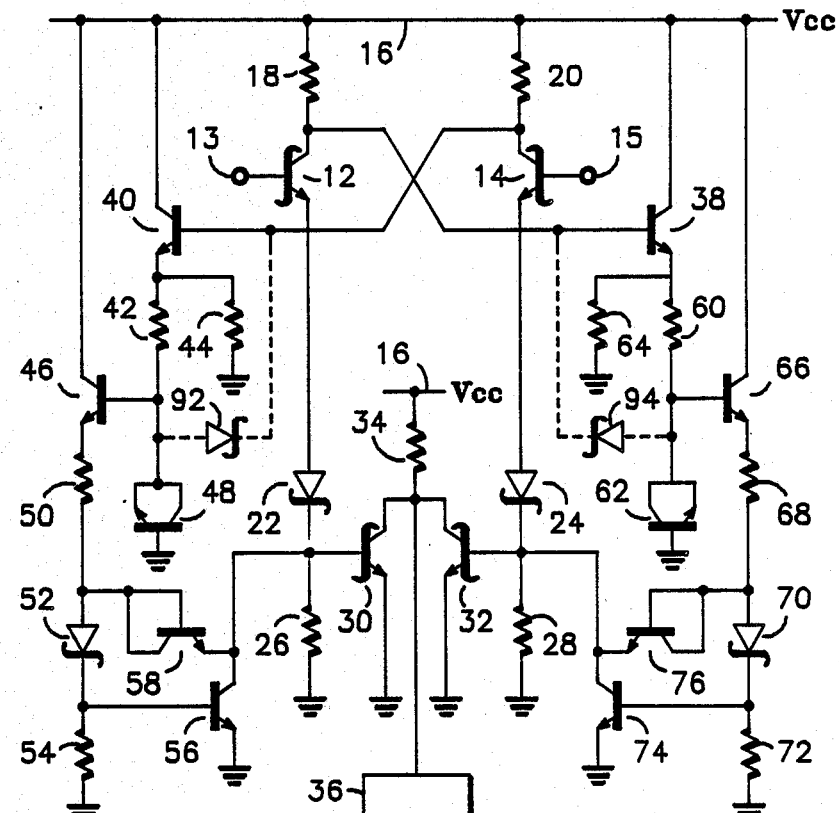
FIG. 1 is a schematic diagram illustrating the pulse doubler circuit of the preferred embodiment.

Turning to FIG. 1 there is shown pulse doubler circuit 10 of the present invention which is suited to be fabricated in monolithic integrated circuit form. As will be more fully explained, the structure and operation of pulse doubler circuit 10 is symmetrical. A pair of input transistors 12 and 14 receive differentially applied input pulses at their respective bases (inputs 13 and 15). Although transistors 12 and 14 are illustrated as being Schottky transistors it is recognized that conventional bipolar NPN transistors can also be used in pulse doubler circuit 10. The collectors of the transistors 12 and 14 are coupled to power supply conductor 16, to which is supplied DC operating potential $V_{cc}$, through respective resistors 18 and 20. The emitters of the transistors are coupled to another power supply conductor, to which is supplied ground reference potential, through respective Schottky diodes 22, 24 and resistors 26, 28. A pair of Schottky transistors 30 and 32 have their collector-emitter conduction paths coupled in parallel between power supply 16, via resistor 34, and ground reference potential. The output 36 of pulse doubler circuit 10 is connected to the commonly connected collectors of transistors 30 and 32. The collectors of transistors 12 and 14 are coupled respectively to the bases of transistors 38 and 40 the collector of the two latter transistors being coupled to power supply conductor 16. The emitter of transistor 40 is connected via resistor 42 to the base of transistor 46 and through resistor 44 to ground reference. A delay element comprising transistor 48 has its base connected to ground reference potential and its collector and emitter connected to the bottom lead of resitor 42 at the base of transistor 46. Transistor 48 functions as a capacitor which in combination with resistors 42 and 44 provide a RC time constant for delaying the turn on of transistor 46 as will be later explained. The collector-emitter path of transistor 46 is coupled between power supply conductor 16 and ground reference via series connected resistor 50, Schottky diode 52 and resistor 54. A clamping and turn-off circuit comprising transistor 56 and diode connected transistor 58 is provided that is coupled across diode 52 to the base of transistor 30.

As previously mentioned, the strucure of pulse doubler circuit 10 is symmetrical in nature in that the collector of input transistor 12 is coupled to the base of transistor 38 the collector-emitter conduction path of which is connected between power supply conductor 16 and ground reference via resistor 60 and delay element 62. The emitter of transistor 38 is also coupled via resistor 64 to ground reference potential and through resistor 60 to the base of transistor 66. The collector-emitter conduction path of transistor 66 is coupled to ground reference through series connected resistor 68, Schottky diode 70 and resistor 72. A clamping and turn-off circuit comprising transistor 74 and diode connected transistor 76 is provided which is connected across diode 70 to the base of output transistor 32.

Figure 2:
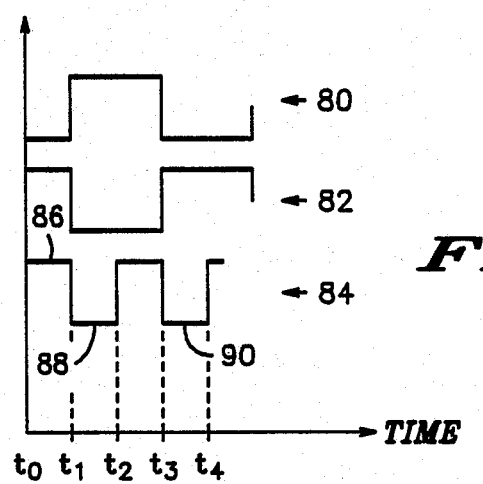
FIG. 2 are waveforms useful for understanding the operation of the circuit of FIG. 1.

Referring to FIG. 2, the operation of pulse doubler circuit 10 is now explained. Assuming at time t0 the input pulse applied to input 13 (waveform 80) is low and the input pulse applied to input 15 (waveform 82) is high, transistor 12 will be non-conducting while transistor 14 is conducting. Therefore diode 22 and transistor 30 will be turned off. In this state it is further assumed the voltage at the base of transistor 32 is clamped at a sufficiently low value by the clamping circuit comprising transistor 74 and associated collector-emitter connected elements to maintain the former in a non-conducting state. Hence, the output of pulse doubler circuit 10 is at a high ouput voltage level, portion 86 of waveform 84. At time $t_1$ the input signal at input 13 switches from a low state to a high state turning transistor 12 on while transistor 14 is turned off. The voltage at the base of transistor 40 will begin to rise toward $V_{cc}$ which turns the device on. Simultaneously diode 22 is turned on to supply base drive to transistor 30 which turns the latter on. This causes the output voltage at terminal 36 to go low to produce negative going pulse 88 thereat. As transistor 40 turns on its emitter current will flow through the RC delay circuit comprising resistor 42 and transistor/capacitor 48. Hence, the voltage at the base of transistor 46 will begin to ramp upwards. Transistor 46 will be delayed from turning on until such time as the voltage at its base has ramped to a level sufficient to exceed the forward turn on bias thereof. This point occurs at time $t_2$. When transistor 46 turns on its emitter current will turn on diode 52 which, in turn, forward biases transistor 56. As transistor 56 is rendered conductive it will sink all of the available emitter current sourced from transistor 12 which causes transistor 30 to be turned off. Thus, at time $t_2$ the voltage at output 36 rises to approximately $V_{cc}$. The width of pulse 88 is equal to the difference in the propagation delays between the switching of operating states of transistors 14, 40, 46 and 56, and diode 52 and the switching of states of transistor 12 and diode 22. Therefore, in response to the leading edge of input pulse 80 changing from low to high, negative pulse 88 is produced at the ouput 36 of pulse doubler circuit 10. It is recognized, due to symmetry, that a second negative output pulse will be produced at output 36 in response to input pulses 80 and 82 changing states from a high to low and low to high respectively. Briefly, as transistor 14 is turned on and transistor 12 is turned off at time $t_3$ transistor 32 is turned on causing the voltage at output 36 to go low thereby initiating output pulse 90. The output will remain low until the RC delay caused by resistor 60 and capacitive transistor 62 allows the voltage at the base of transistor 66 to ramp past the forward bias threshold of the latter. As transistor 66 turns on, transistor 74 is render conducting at time $t_4$ to cause the ouput voltage at output 36 to go high. Hence, for each cycle of input pulse a pair of output pulse are produced.

To shorten the charge removal time from capacitive transistors 48 and 62, which would otherwise be of long duration if the capacitance value thereof is made large, a pair of Schottky diodes 92 and 94, shown in dashed outline, could be coupled respectively between the bases of transistors 46 and 66 and the collectors of transistors 12 and 14. Thus, for instance, as transistor 12 turns on, the voltage at the collector of transistor 12 will fall causing diode 94 to turn on which assists resistor 60 and 64 in the necessary removal of the charge from the emitter of transistor 38, the base of transistor 66 and the collector-emitter of transistor 62.

Hence, what has been described above is an improved pulse doubler circuit for producing a pair of output pulses for each cycle of an applied input pulse.

I claim:

1. A pulse doubler circuit for producing a pair of pulses at an output thereof for each cycle of differentially applied input pulses, comprising:
   first and second input transistor circuit means which are differentially rendered conductive and non-conductive respectively in response to the input pulses;
   first and second output transistor circuit means coupled respectively to said first and second input transistor circuit means, said first output transistor circuit means being rendered conductive by said first input transistor circuit means being rendered conductive for causing the voltage at the output of the pulse doubler circuit to change from a first level to a second level, said second output transistor circuit means being rendered conductive in response to said second input transistor circuit means being rendered conductive for causing said voltage at the output of the pulse doubler circuit to change from said first level to said second level; and
   first and second delay circuit means, said first delay circuit means being responsive to said second input transistor circuit means being rendered non-conductive as said first input transistor circuit means is rendered conductive for causing said first output transistor circuit means to be turned off a predetermined time thereafter such that said voltage at the output of the circuit changes from said second level to said first level and said second delay circuit means being responsive to said first input transistor circuit means being rendered non-conductive as said second input transistor circuit means is rendered conductive for causing said second output transistor circuit means to turned off a predetermined time thereafter such that said voltage at the output of the circuit changes from said second level to said first level.

2. The pulse doubler circuit of claim 1 wherein said first input transistor circuit means includes a transistor having a base, collector and emitter, said base being coupled to a first input of the pulse doubler circuit, said collector being coupled both to a first power supply conductor to which an operating potential is supplied and to said second delay circuit means, and said emitter being coupled to said first transistor output circuit means.

3. The pulse doubler circuit of claim 2 wherein said first delay circuit means includes:
   a first transistor having a base, a collector and an emitter, said base being coupled to said second input transistor circuit means, said collector being coupled to said first power supply conductor;
   a second transistor having a base, a collector and an emitter, said base being coupled to said emitter of said first transistor of said first delay circuit means, said collector being coupled to said first power supply conductor; and
   a third transistor having a base, a collector and an emitter, said base being coupled to said emitter of said second transistor of said first delay circuit means, said collector being coupled to said first output transistor circuit means and said emitter being coupled to a second power supply conductor.

4. The pulse doubler circuit of claim 3 wherein said first delay circuit means includes:

a first resistor coupled between said emitter and said base of said first and second transistors respectively of said first delay circuit means; and capacitive means coupled between said base of said second transistor of said first delay circuit means and said second power supply conductor.

5. The pulse doubler circuit of claim 4 wherein said capacitive means includes a transistor having a base coupled to said second power supply conductor, an emitter and a collector each connected to said base of said second transistor of said first delay circuit means.

6. The pulse doubler circuit of claim 5 wherein said first output transistor circuit means is a transistor having a base coupled to the collector of said third transistor of said first delay circuit means, a collector coupled to the output of the pulse doubler circuit and an emitter coupled to said second power supply conductor.

7. The pulse doubler circuit of claim 6 wherein said second input transistor circuit means includes a transistor having a base, collector and emitter, said base being coupled to a second input of the pulse doubler circuit, said collector being coupled both to said first power supply conductor and to said first delay circuit means, and said emitter being coupled to said second transistor output circuit means.

8. The pulse doubler circuit of claim 7 wherein said second delay circuit means includes:

a first transistor having a base, a collector and an emitter, said base being coupled to said first input transistor circuit means, said collector being coupled to said first power supply conductor;

a second transistor having a base, a collector and an emitter, said base being coupled to emitter of said first transistor of said second delay circuit means, said collector being coupled to said first power supply conductor; and a third transistor having a base, a collector and an emitter, said base being coupled to said emitter of said second transistor of said second delay circuit means, said collector being coupled to said second output transistor circuit means and said emitter being coupled to said second power supply conductor.

9. The pulse doubler circuit of claim 8 wherein said second delay circuit means includes:

a first resistor coupled between said emitter and said base of said first and second transistors respectively of said second delay circuit means; and capacitive means coupled between said base of said second transistor of said second delay circuit means and said second power supply conductor.

10. The pulse doubler circuit of claim 9 wherein said capacitive means includes a transistor having a base coupled to said second power supply conductor, an emitter and a collector each connected to said base of said second transistor of said second delay circuit means.

11. The pulse doubler circuit of claim 10 wherein said second output transistor circuit means is a transistor having a base coupled to the collector of said third transistor of said second delay circuit means, a collector coupled to the output of the pulse doubler circuit and an emitter coupled to said second power supply conductor.

* * * * *